United States Patent
Aoyama

(10) Patent No.: US 9,532,409 B1
(45) Date of Patent: Dec. 27, 2016

(54) MICROWAVE IRRADIATION APPARATUS AND SUBSTRATE TREATMENT METHOD

(71) Applicant: KABUSHIKI KAISHA TOSHIBA, Tokyo (JP)

(72) Inventor: Tomonori Aoyama, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/059,680

(22) Filed: Mar. 3, 2016

(30) Foreign Application Priority Data

Sep. 24, 2015 (JP) ................. 2015-186989

(51) Int. Cl.
| | | |
|---|---|---|
| H01L 21/00 | (2006.01) | |
| H05B 6/64 | (2006.01) | |
| H01L 21/324 | (2006.01) | |
| H01L 21/67 | (2006.01) | |
| H05B 6/70 | (2006.01) | |

(52) U.S. Cl.
CPC ........... *H05B 6/6411* (2013.01); *H01L 21/324* (2013.01); *H01L 21/67115* (2013.01); *H05B 6/708* (2013.01)

(58) Field of Classification Search
None
See application file for complete search history.

(56) References Cited

U.S. PATENT DOCUMENTS

| | | | |
|---|---|---|---|
| 7,928,021 B2 | 4/2011 | Kowalski et al. | |
| 8,093,141 B2 | 1/2012 | Aoyama et al. | |
| 8,435,872 B2 | 5/2013 | Aoyama | |
| 8,552,411 B2 | 10/2013 | Aoyama et al. | |
| 8,883,642 B2 | 11/2014 | Kai et al. | |
| 9,029,247 B2 | 5/2015 | Suguro | |
| 9,082,822 B2 | 7/2015 | Isogai et al. | |
| 2011/0008952 A1 | 1/2011 | Aoyama | |
| 2011/0111580 A1 | 5/2011 | Aoyama et al. | |
| 2012/0225498 A1 | 9/2012 | Aoyama et al. | |
| 2013/0280911 A1 | 10/2013 | Kai et al. | |
| 2014/0004690 A1 | 1/2014 | Isogai et al. | |
| 2014/0065805 A1 | 3/2014 | Suguro | |
| 2014/0073065 A1 | 3/2014 | Ohno et al. | |
| 2014/0087547 A1 | 3/2014 | Miyano et al. | |
| 2015/0179533 A1 | 6/2015 | Aoyama et al. | |
| 2015/0235878 A1 | 8/2015 | Suguro | |
| 2015/0255317 A1 | 9/2015 | Suguro et al. | |
| 2015/0263033 A1 | 9/2015 | Aoyama | |

FOREIGN PATENT DOCUMENTS

| | | |
|---|---|---|
| JP | 9-116160 | 5/1997 |
| JP | 2009-32814 | 2/2009 |

*Primary Examiner* — Angel Roman
(74) *Attorney, Agent, or Firm* — Finnegan, Henderson, Farabow, Garrett & Dunner LLP

(57) ABSTRACT

In accordance with an embodiment, a microwave irradiation apparatus includes a chamber and a polarizing plate. The chamber is configured to accommodate a substrate and is provided with an introduction port to introduce the microwave applied to the substrate from a direction at an angle within a range of ±45 degrees to a direction horizontal to a surface of the substrate. The polarizing plate is installed between the introduction port and the substrate, and selectively transmits a microwave where an amplitude direction of a magnetic field or an electric field is vertical to the surface of the substrate.

13 Claims, 16 Drawing Sheets

MICROWAVE IRRADIATION APPARATUS AND SUBSTRATE TREATMENT METHOD

CROSS REFERENCE TO RELATED APPLICATIONS

This application is based upon and claims the benefit of priority from the prior Japanese Patent Application No. 2015-186989, filed on Sep. 24, 2015, the entire contents of which are incorporated herein by reference.

FIELD

Embodiments described herein relate generally to a microwave irradiation apparatus and a substrate treatment method.

BACKGROUND

It has been suggested to utilize microwave annealing instead of thermal annealing using an infrared ray radiation, and in the microwave annealing, a solid-phase epitaxial growth rate of, e.g., silicon is increased to decrease a thermal load to a device and to reduce a dangling bond, and hence an interface is modified.

Furthermore, in the microwave annealing, there are required a reaction rate increase and an interface modification at a lower temperature than in the thermal annealing.

DETAILED DESCRIPTION

In accordance with an embodiment, a microwave irradiation apparatus includes a chamber and a polarizing plate. The chamber is configured to accommodate a substrate and is provided with an introduction port to introduce the microwave applied to the substrate from a direction at an angle within a range of ±45 degrees to a direction horizontal to a surface of the substrate. The polarizing plate is installed between the introduction port and the substrate, and selectively transmits a microwave where an amplitude direction of a magnetic field or an electric field is vertical to the surface of the substrate.

Embodiments will now be explained with reference to the accompanying drawings. Like components are provided with like reference signs throughout the drawings and repeated descriptions thereof are appropriately omitted. In addition, it is to be noted that the accompanying drawings are provided to describe each invention and promote an understanding thereof, and shapes, dimensions, ratios, and others in the respective drawings may be different from those in an actual apparatus in some parts.

In this specification, terms representing directions such as upper and lower directions in the description denote relative directions when a treatment target layer side such as a later-described amorphous silicon layer is determined as an upper side. Thus, they are different from actual directions based on a gravitational accelerating direction in some cases.

(A) Substrate Treatment Method

An example of an annealing treatment using microwaves will be described.

(1) Embodiment 1

Figure 1:
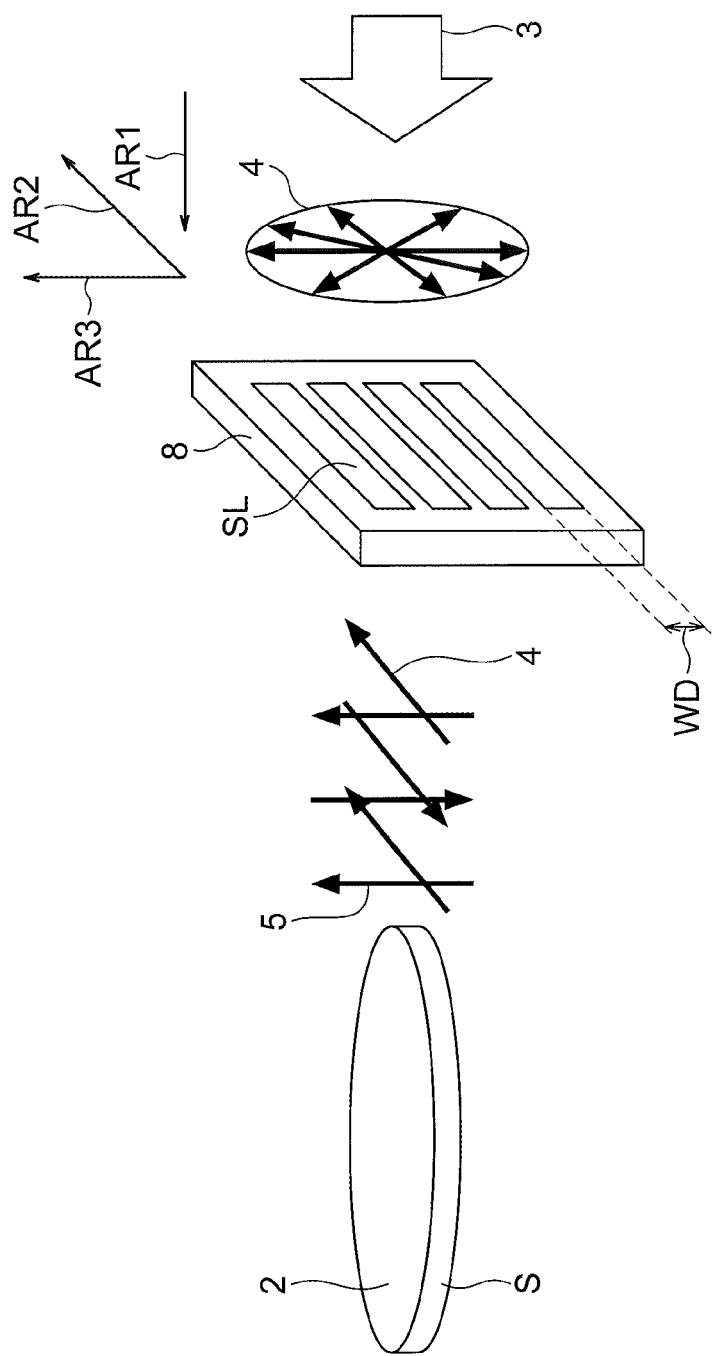
FIG. 1 is an example of a schematic view for explaining an outline of a substrate treatment method according to Embodiment 1.

FIG. 1 is an example of a schematic view for explaining an outline of a substrate treatment method according to Embodiment 1.

First, a semiconductor substrate having a treatment target layer formed on an upper surface thereof is prepared. In this embodiment, a silicon substrate S including impurities, e.g., B (boron) or P (phosphorus) is prepared as a semiconductor substrate, and an amorphous silicon layer 2 formed on the silicon substrate S by implanting Ge (germanium) ions is taken as a treatment target layer. The semiconductor substrate is not restricted to such a silicon substrate S, and it can be also applied to a silicon substrate having no impurity ion implanted therein as well as a compound semiconductor substrate containing, e.g., indium gallium (InGa) or gallium arsenic (GaAs).

Then, a metal slit 8 is installed between a non-illustrated microwave irradiation source (see reference numeral 60 in FIGS. 18 to 21) and the silicon substrate S. At this time, in this embodiment, the metal slit 8 is installed in such a manner that a longitudinal direction of openings SL of the metal slit 8 corresponds to a direction AR2 which is horizontal to a surface of the silicon substrate S and different from an irradiating direction of microwaves. In this embodiment, the metal slit 8 corresponds to, e.g., a polarizing plate.

Then, a microwave 3 is applied to the silicon substrate S from the non-illustrated microwave irradiation source in a direction AR1 which is horizontal to the surface of the silicon substrate S. Although the direction AR2 of the openings SL of the metal slit 8 and an incidence direction AR1 of the microwave 3 are orthogonal to each other in this embodiment, but the present invention is not restricted thereto, and these directions have only to cross each other.

Figure 2:
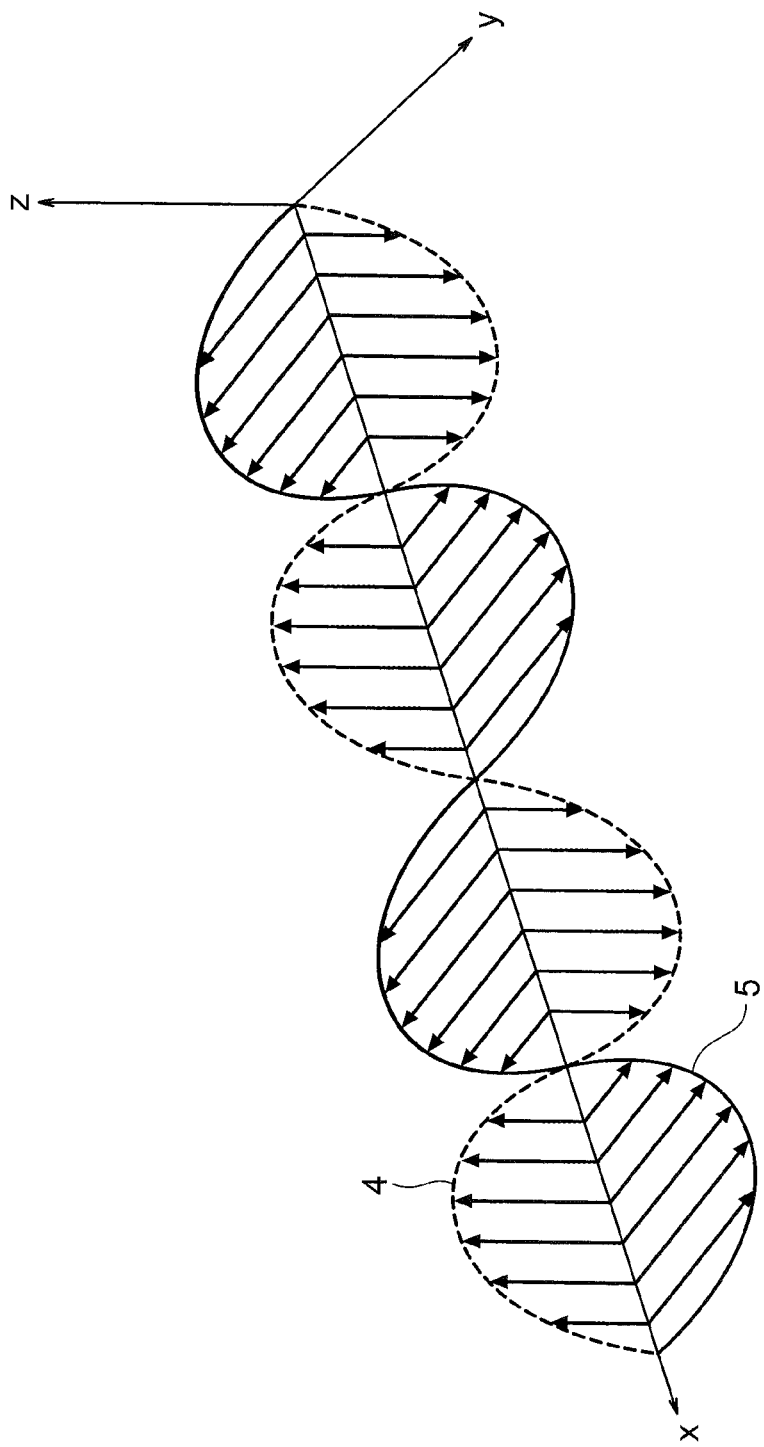
FIG. 2 is an example of a schematic view for showing amplitude directions of a magnetic field and an electric field in association with a traveling direction of a microwave.

As described above, when the metal slit 8 is arranged between the silicon substrate S and the microwave irradiation source in such a manner that the longitudinal direction of the openings SL corresponds to the direction AR2 horizontal to the surface of the silicon substrate S and the microwaves are applied from the direction AR1 horizontal to the surface of the silicon substrate S, of the microwaves having the electric fields 4 with various amplitude directions a microwave having an electric field 4 whose amplitude direction is equal to the longitudinal direction AR2 of the openings SL of the metal slit 8 passes through the metal slit 8. As shown in FIG. 2, since an amplitude direction of a magnetic field 5 in electromagnetic radiations has an angle of 90° to the amplitude direction of the electric field 4, an amplitude direction of a magnetic field 5 of the microwave 3 that has passed through the metal slit 8 is a direction AR3 vertical to the surface of the silicon substrate S.

Figure 3:
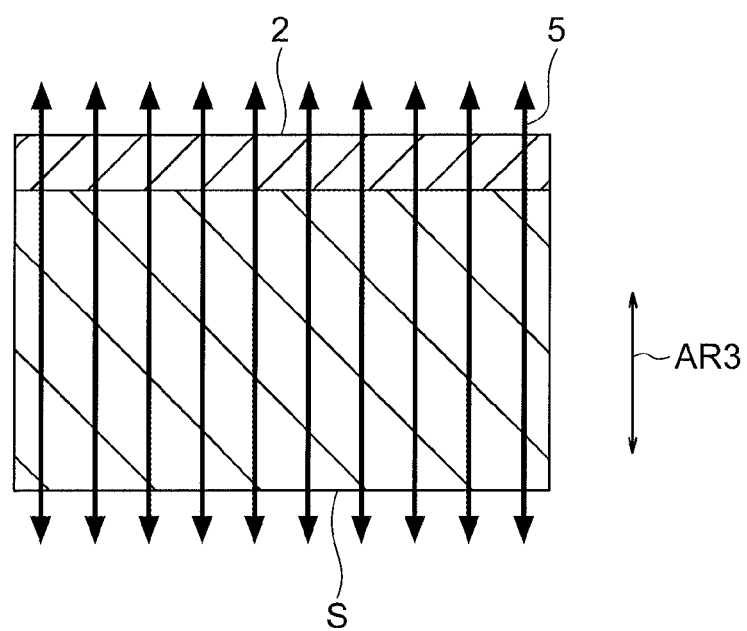
FIG. 3 is an example of a view schematically showing an effect provided by a manufacturing method depicted in FIG. 1.

Consequently, as shown in FIG. 3, since the direction AR3 vertical to the surface of the silicon substrate S is the amplitude direction of the magnetic field, the same power as power applied to the silicon substrate S is also given to the amorphous silicon layer 2. Consequently, a reaction of solid-phase epitaxial growth highly efficiently progresses.

Figure 17:
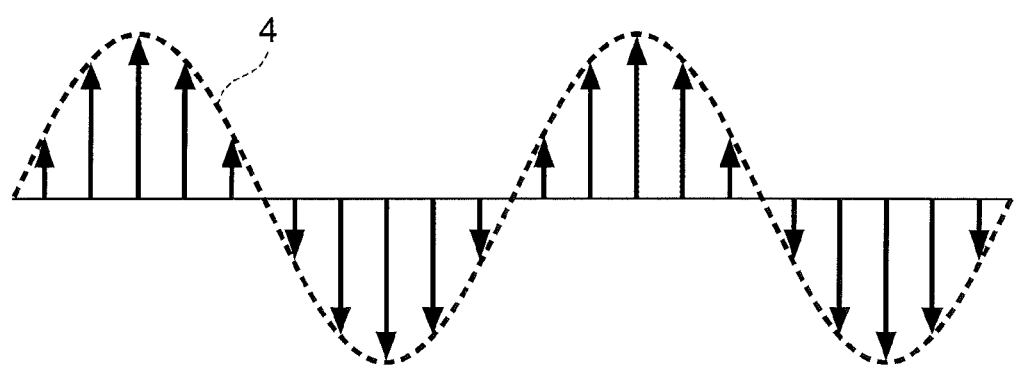
FIG. 17 is an example of a view schematically showing an electric field of a microwave applied to a silicon substrate according to a manufacturing method depicted in FIG. 14.

It is to be noted that, in FIG. 2, to easily discriminate the magnetic field 5 from the electric field 4, the magnetic field 5 are indicated by a solid line and the electric fields 4 are indicated by a broken line. This point is also applied to FIG. 8 and FIG. 17.

Figure 4:
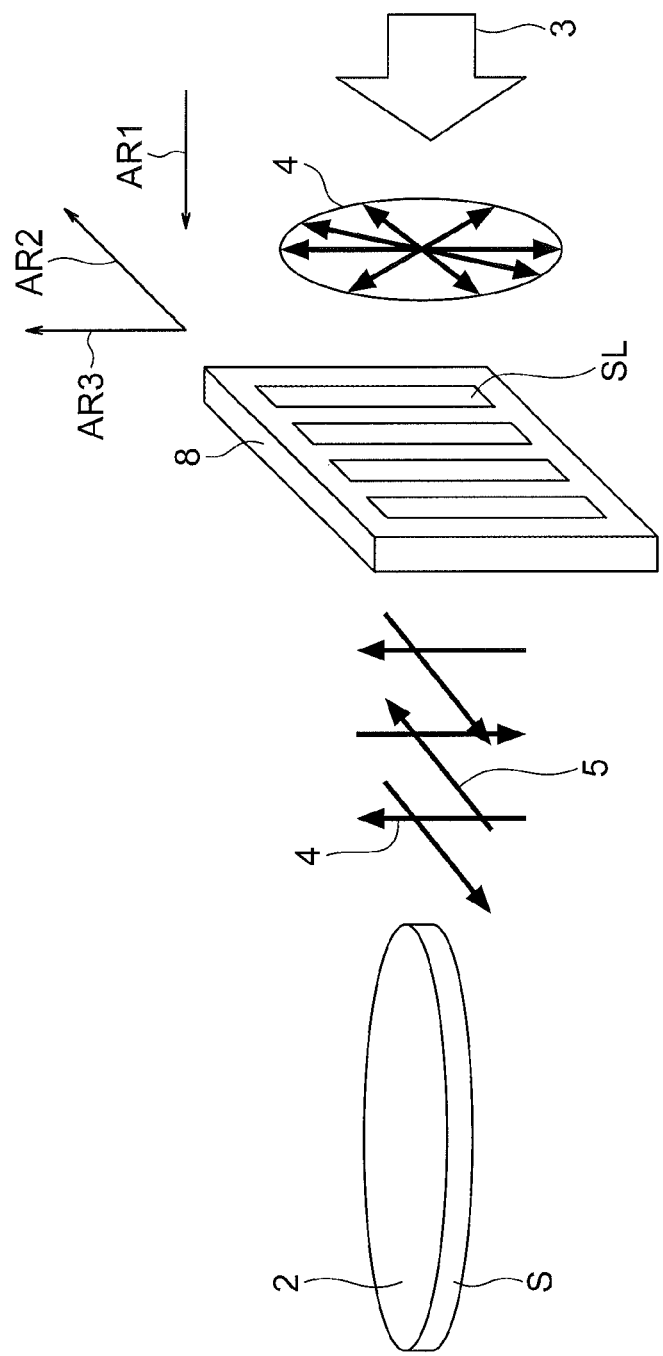
FIG. 4 is an example of a schematic view for explaining a comparative example of the substrate treatment method according to Embodiment 1.
Figure 5:
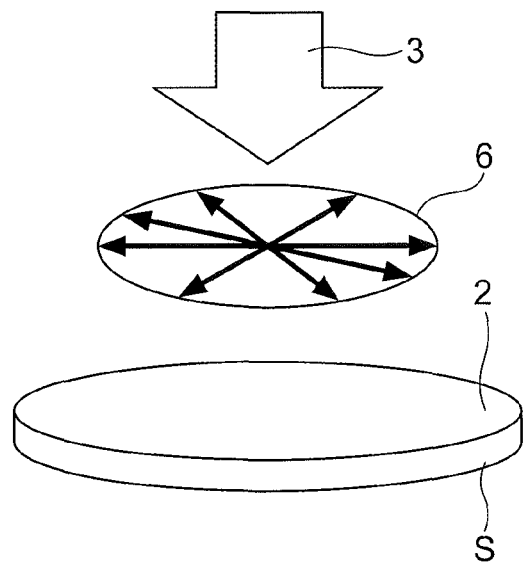
FIG. 5 is an example of a schematic view showing a case where a microwave is applied from a direction vertical to a surface of a silicon substrate.
Figure 6:
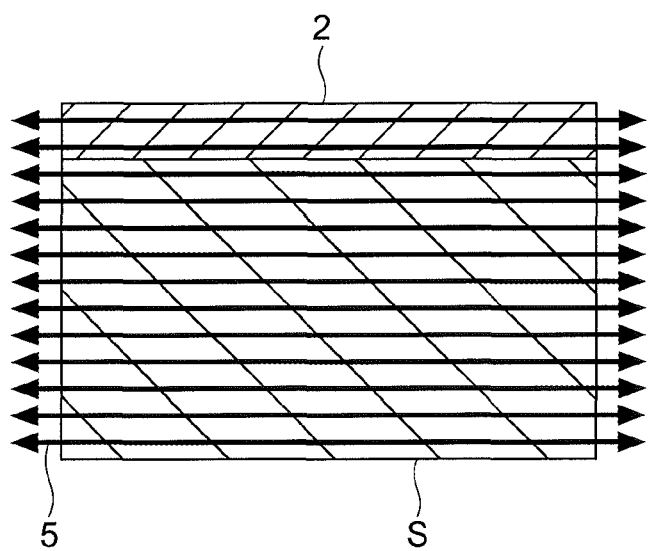
FIG. 6 is an example of a schematic view for explaining a problem of microwave irradiation shown in FIG. 5.

As Comparative Example 1, FIG. 4 shows an example where the metal slit 8 is arranged in such a manner that the longitudinal direction of its openings SL corresponds to the direction AR3 vertical to the surface of the silicon substrate S. According to Comparative Example 1 shown in FIG. 4, only the microwave 3 having the magnetic field 5 whose amplitude direction is the direction AR2 horizontal to the surface of the silicon substrate S is applied to the substrate S, and hence this is the same as a case where microwaves are applied from above the silicon substrate S, which is schematically shown in FIG. 5. Consequently, as shown in FIG. 6, the power of substantially all the microwaves is given to the silicon substrate S and used for the purpose of heating the silicon substrate S, there is almost no power of the microwaves for use in the solid-phase epitaxial growth of the amorphous silicon layer 2. As a result, a solid-phase epitaxial growth rate in the amorphous silicon layer 2 to be reacted falls in the same range as that in thermal annealing by an infrared ray radiation using a furnace at the very most.

Figure 7:
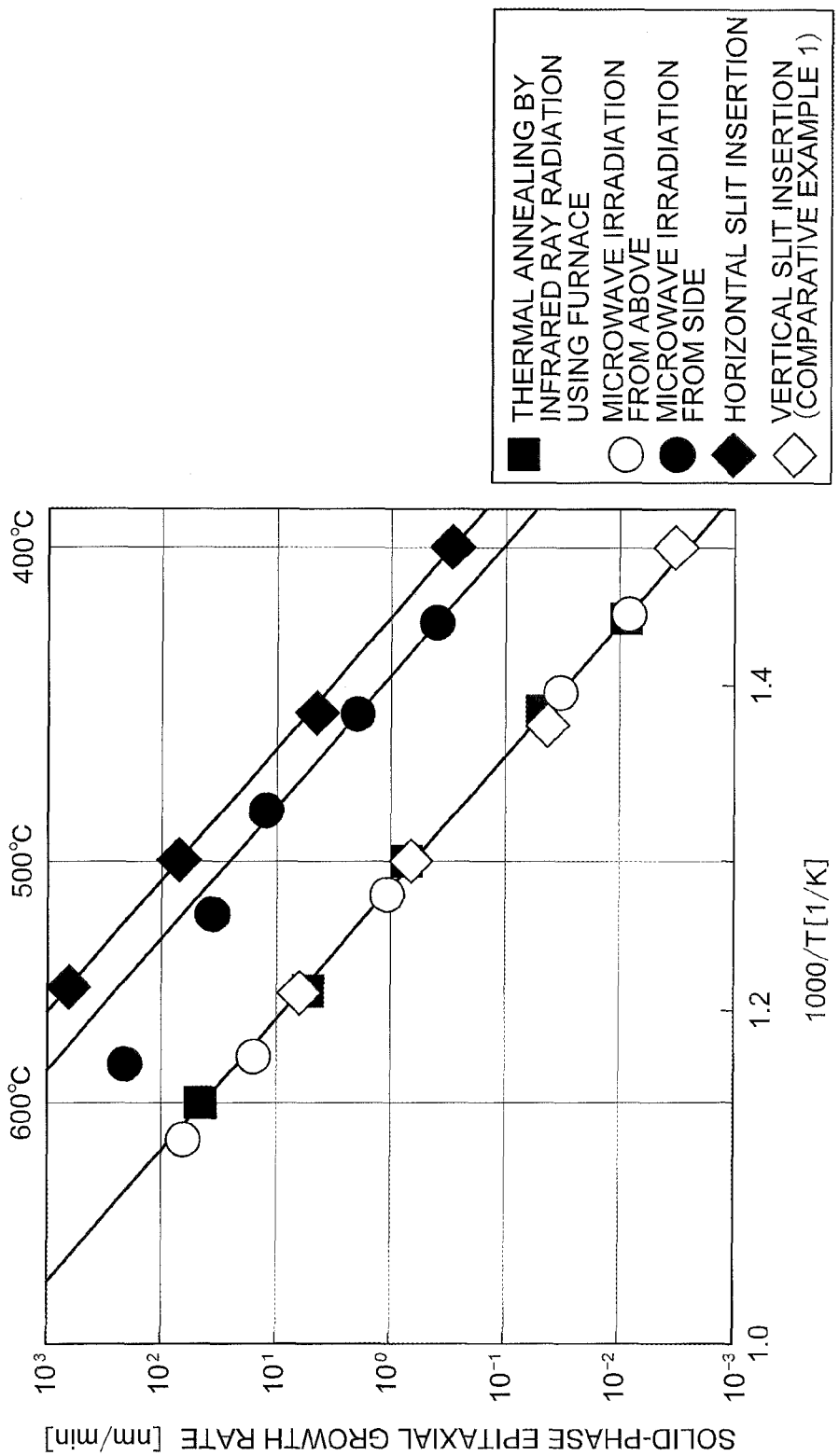
FIG. 7 is an example of a graph for explaining an effect of the substrate treatment method according to Embodiment 1.

A graph shown in FIG. 7 is provided by measuring and plotting reaction temperatures and solid-phase epitaxial growth rates in several annealing methods including this embodiment.

Like Comparative Example 1, when the metal slit 8 is installed in such a manner that the microwave having the magnetic field 5 whose amplitude direction is horizontal to the surface of the silicon substrate S is applied to the silicon substrate S, as shown in FIG. 7, only a growth rate that is similar to that in a case where the microwaves are applied from above the silicon substrate S is provided, and the solid-phase epitaxial growth rate is poorer than that in a case where the microwaves are simply applied from a transverse direction (the direction horizontal to the surface of the silicon substrate S) without installing the metal slit 8.

Contrarily, like this embodiment, when the metal slit 8 is installed in such a manner that the microwave 3 having the magnetic field 5 whose amplitude direction is vertical to the surface of the silicon substrate S is applied to the silicon substrate S, the same power as the power given to the silicon substrate S is also given to the amorphous silicon layer 2 (see FIG. 3). Consequently, it is possible to provide a solid-phase epitaxial growth rate higher than that in the case where the microwaves are simply applied from the transverse direction (the direction horizontal to the surface of the silicon substrate S) without installing the metal slit 8.

Moreover, it can be understood from FIG. 7 that an increase in solid-phase epitaxial growth rate is lowered at temperatures higher than approximately 550° C. in the microwave irradiation from the transverse direction (the direction horizontal to the surface of the silicon substrate S), whereas a high solid-phase epitaxial growth rate is provided even at temperatures higher than 500° C. when the metal slit 8 is installed in such a manner that the longitudinal direction of the openings SL corresponds to the direction AR2 horizontal to the surface of the silicon substrate S like this embodiment. It is to be noted that a growth rate of the amorphous silicon layer 2 can be measured by using, e.g., an ellipsometer.

As a size of the metal slit 8, a desirable value differs depending on an installing position of the metal slit 8. In a case of installing the metal slit 8 near the silicon substrate S a large size is required, but a size larger than that of an introduction port of the microwave 3 (see reference numeral 40 in FIG. 18) can suffice in a case of installing the metal slit 8 near the introduction port provided in, e.g., a wall surface of a chamber.

As a width of each opening SL of the metal slit 8 (see reference sign WD in FIG. 1), a size that enables each electric field whose amplitude direction is the longitudinal direction AR2 of the openings SL to pass therethrough can suffice, and a range of approximately 1 mm to approximately 3 mm is enough when a frequency of the microwave 3 is, e.g., 5.8 GHz and a size of the introduction port (see reference numeral 40 in FIG. 18) is, e.g., approximately 20 mm×40 mm.

The metal slit 8 that can control amplitudes of electric fields to desired directions can suffice, and it functions as a polarizing plate in this regard. Thus, without being restricted to the metal slit, it is possible to adopt any other polarizing mechanism having a plurality of parallel lines drawn with the use of a metal on a tabular material such as quartz having transparent properties to microwaves as long as it has a polarizing function to the microwaves.

An influence when the magnetic field 5 is transmitted through the silicon substrate 1 will now be described with reference to FIG. 8 to FIG. 11.

Figure 8:
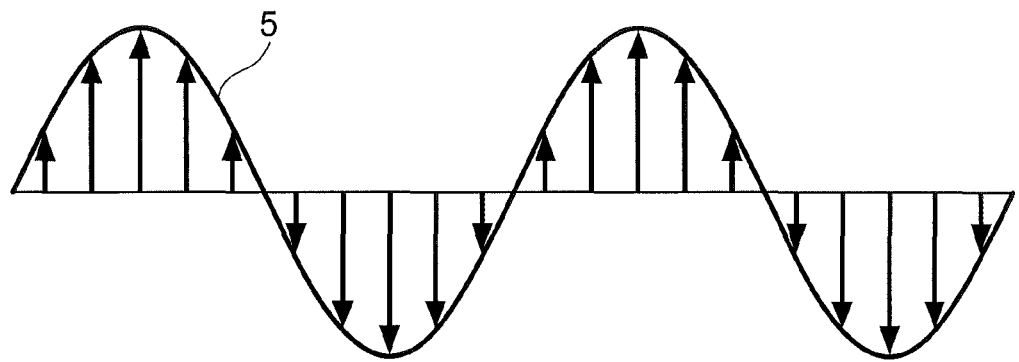
FIG. 8 is an example of a view schematically showing a magnetic field of the microwave applied to the silicon substrate by the manufacturing method depicted in FIG. 1.
Figure 9:
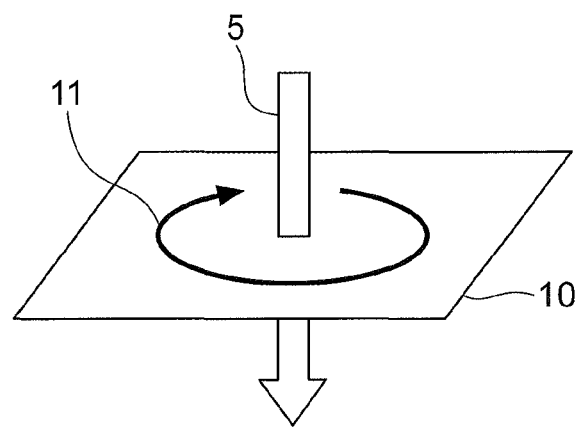
FIG. 9 is an example of a schematic view for explaining an effect of a magnetic field to a conductor or a semiconductor.

When the magnetic field 5 is transmitted through a conductor or a semiconductor, an induction current flows in a clockwise direction with respect to a traveling direction of the magnetic fields 5. Thus, for example, when the magnetic field 5 shows amplifications as depicted in FIG. 8, an eddy current 11 is produced in a conductor 10 in a plane vertical to a direction of the amplifications as depicted in FIG. 9. When impurities used in manufacture of a semiconductor circuit, e.g., impurities such as boron, arsenic, and phosphor are contained in the silicon substrate S, the impurities function as carriers as a temperature of the silicon substrate S rises, the resistance of the silicon substrate S thus becomes lower, and hence the eddy current 11 flowing through the silicon substrate S increases. Since this eddy current 11 causes Joule heat, the silicon substrate S is heated.

Figure 10:
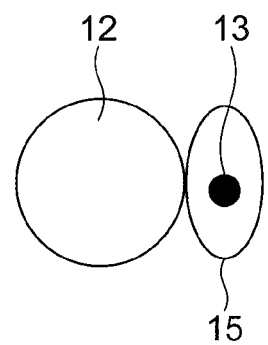
FIG. 10 is an example of a schematic view for explaining an effect of a fluctuation of a magnetic field to a dangling bond.
Figure 11:
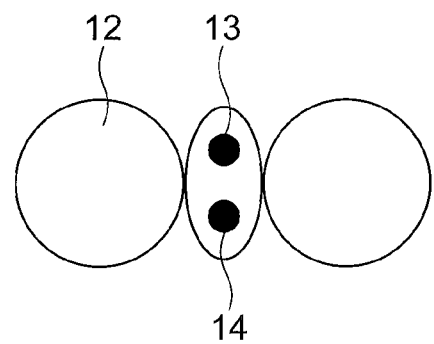
FIG. 11 is an example of a schematic view for explaining electrons forming a pair required for bonding of silicon atoms.
Figure 12:
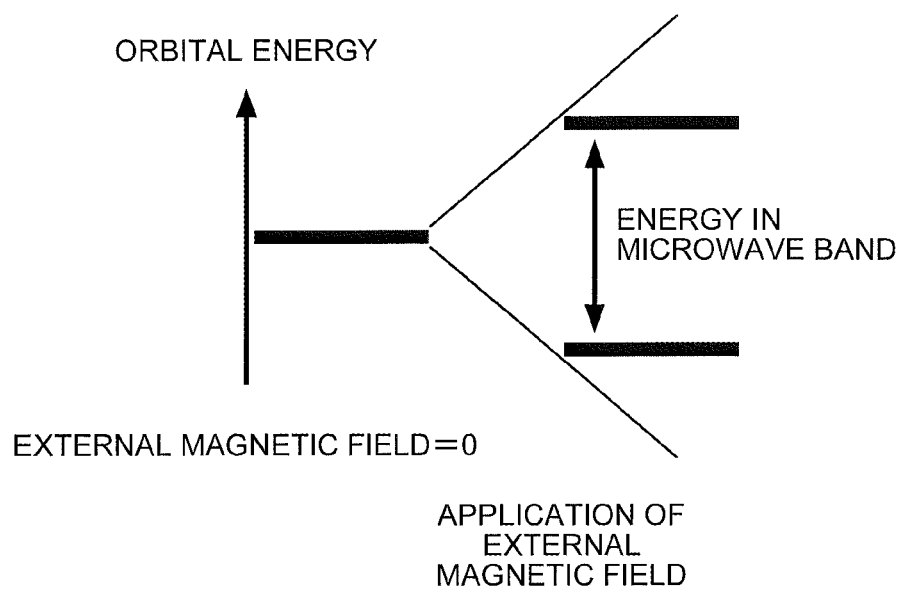
FIG. 12 is an example of a schematic view showing a correspondence relation between orbital energy split by Zeeman effect and energy in a microwave band.

On the other hand, uncombined hands called dangling bonds are present in amorphous silicon. For example, as shown in FIG. 10, an uncombined hand of a silicon atom 12 has no electron pair required for bonding (see reference numeral 14 in FIG. 11). Thus, an electron 13 has a spin. When the direct current (DC) magnetic field 5 is applied to the electron 13 having the spin, orbital energy which is degenerated when the magnetic field 5 is not present is split by application of the magnetic field 5 (Zeeman effect). In this case, the split level energy corresponds to several GHz, and just corresponds to energy in a microwave band.

It is considered that, when a dangling bond is irradiated with the magnetic field 5 fluctuating as depicted in FIG. 8, the Zeeman effect occurs in accordance with a cycle of the magnetic field 5, the unpaired electron 13 having the spin which constitutes the dangling bond absorbs the microwave 3 and becomes an active state, and the solid-phase epitaxial growth is thereby promoted.

In addition, since the dangling bonds are also present in a gate insulating film, it can be considered that not only the solid-phase epitaxial growth but also termination of the dangling bonds on the interface by crosslinking using oxygen or the like occurs due to a fluctuation in magnetic field. Therefore, when the gate insulating film is irradiated with the microwaves by the same method as this embodiment, an interface modification effect can be provided.

(2) Embodiment 2

A substrate treatment method according to Embodiment 2 will now be described with reference to FIG. 13 to FIG. 17.

Figure 13:
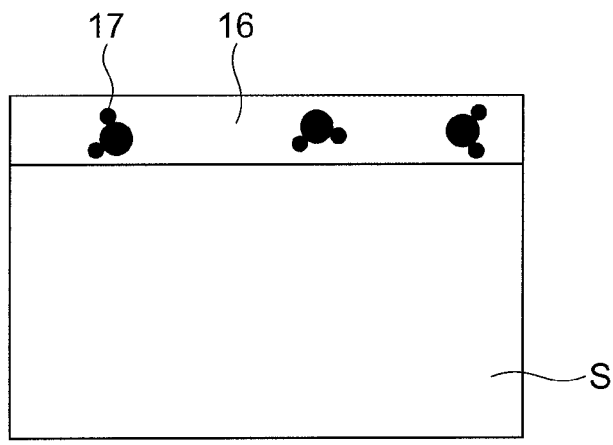
FIG. 13 is an example of a schematic view for explaining an example of a treatment target layer in a substrate treatment method according to Embodiment 2.

First, a schematic cross-sectional view of FIG. 13 shows an example of a semiconductor substrate having a treatment target layer formed on its upper surface according to this embodiment. The treatment target layer shown in FIG. 13 is provided by forming a coating film 16 which includes silicon oxide and carbon (C), or includes metal oxide and carbon (C) on a silicon substrate S, and adding water molecules 17 in this coating film 16. The water molecules 17 can be added by, e.g., exposing the coating film 16 to water vapor or immersing the coating film 16 in an aqueous solution.

Figure 14:
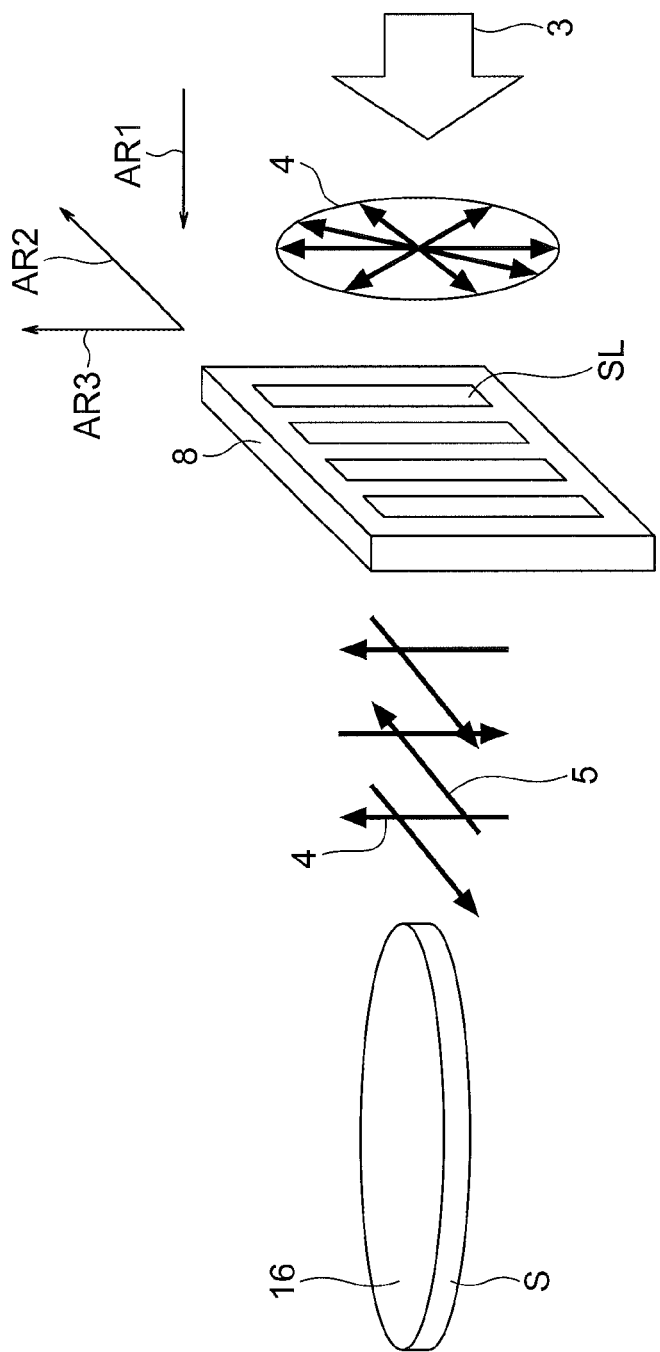
FIG. 14 is an example of a schematic view for explaining an outline of the substrate treatment method according to Embodiment 2.

FIG. 14 is an example of a schematic view for explaining an outline of a substrate treatment method according to this embodiment. As obvious from a comparison with FIG. 1, in this embodiment, like Comparative Example 1 in FIG. 4, a metal slit 8 is arranged in such a manner that a longitudinal direction of its openings SL corresponds to a direction AR3 that is vertical to a surface of, the silicon substrate S and different from an irradiating direction of microwaves, and a microwave 3 is applied to the silicon substrate S from a non-illustrated microwave irradiation source (see reference numeral 60 in FIG. 18) in a direction AR1 horizontal to the surface of the silicon substrate S1. Consequently, only the microwave 3 having an electric field 4 whose amplitude direction is the direction AR3 vertical to the surface of the silicon substrate S and a magnetic field 5 whose amplitude direction is a direction AR2 horizontal to the surface of the silicon substrate S is transmitted through the metal slit 8. As a result, the water molecules 17 in the coating film 16 rotate by the electric field 4 having the amplitudes in the direction AR3 vertical to the surface of the silicon substrate S. The rotation of the water molecules 17 causes an oxidation effect of the coating film 16, thereby reducing carbon residue concentration in the coating film 16.

To confirm such an oxidation effect in the coating film 16, microwave annealing was performed at 450° C. for 10 minutes.

As Comparative Example 2, annealing was performed at 450° C. for 10 minutes through thermal annealing by an infrared ray radiation using a furnace. Additionally, as Comparative Example 3, like Embodiment 1 shown in FIG. 1, the metal slit 8 was installed in such a manner that a longitudinal direction of the openings SL of the metal slit 8 corresponds to the direction AR2 horizontal to the surface of the silicon substrate S, and the microwave 3 was applied to the silicon substrate S from the microwave irradiation source in the direction AR1 horizontal to the surface of the silicon substrate S. Further, the carbon residue concentration in the coating film 16 after the annealing was examined by SIMS (Secondary Ion Mass Spectroscopy).

Figure 15:
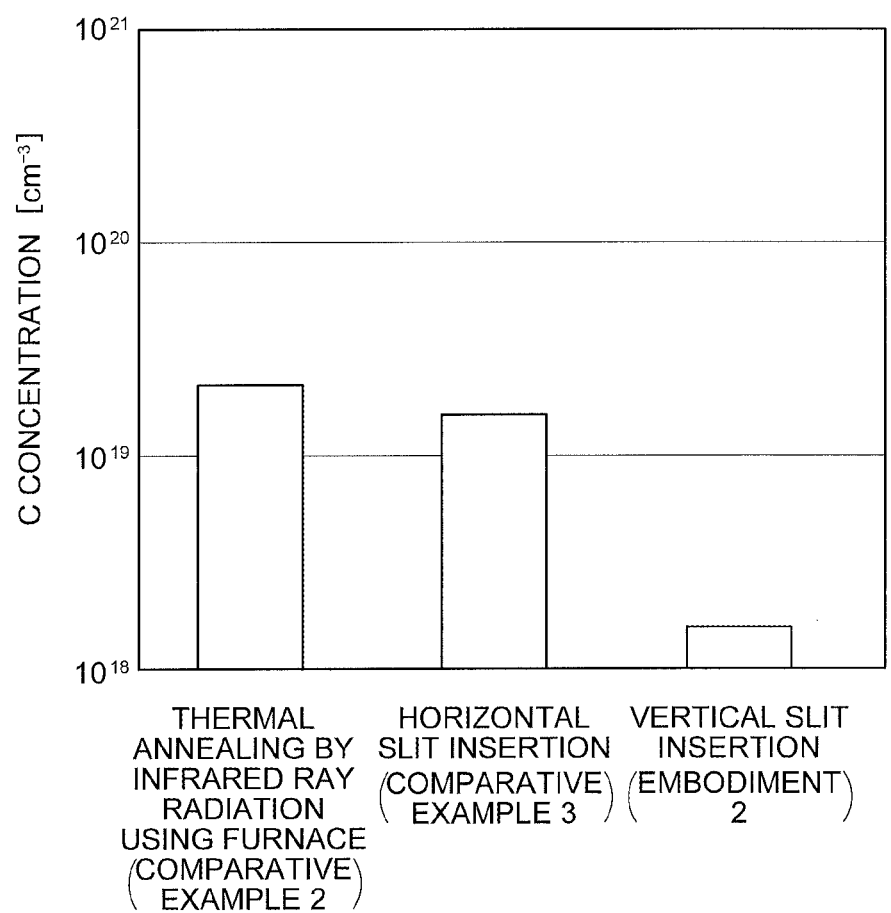
FIG. 15 is an example of a graph for explaining an effect of the substrate treatment method according to Embodiment 2.

A graph of FIG. 15 shows an example of such an examination result.

It can be understood from FIG. 15 that the carbon residue concentration was only slightly reduced in Comparative Example 3 where the metal slit 8 was installed in such a manner that the longitudinal direction of the openings SL was horizontal to the surface of the silicon substrate S as compared with Comparative Example 2 which was based on the thermal annealing by an infrared ray radiation using a furnace.

In contrast, it can also be understood from FIG. 15 that carbon residue concentration in this embodiment where the metal slit 8 was installed in such a manner that the longitudinal direction of the openings SL was the direction AR3 vertical to the surface of the silicon substrate S was reduced by nearly one digit as compared with Comparative Example 3.

Figure 16:
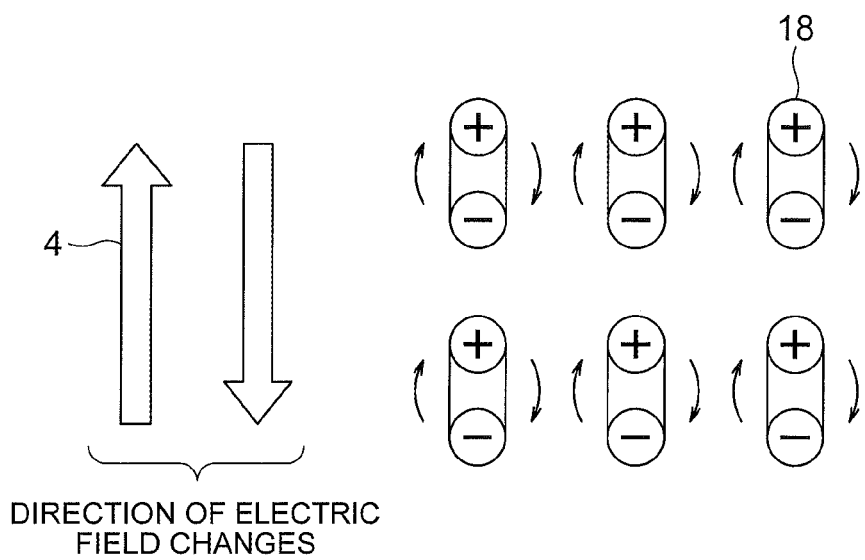
FIG. 16 is an example of a schematic view for explaining an effect of a fluctuation in an electric field onto electric dipoles.

As schematically shown in FIG. 16, when the electric field fluctuates (see FIG. 17) in association with electric dipoles 18 having polarities like the water molecules, the electric dipoles 18 having the polarities set up a rotary movement to follow the fluctuation in the electric field 4. It can be considered that the electric dipoles 18 collide with atoms constituting the coating film 16 by this rotary movement, and an oxidation reaction is thereby promoted. The coating film 16 has carbon (C) contained therein, and the carbon turns to a compound such as $CH_x$ by the active water molecules and vaporizes from the coating film 16.

Consequently, the carbon residue concentration in the coating film 16 is considered to become lower. It is to be noted that, if enough water molecules are present, there is also carbon which turns to not only $CH_x$ but also CO or $CO_2$ to be removed from the coating film 16.

In this embodiment, since the magnetic field 5 having the amplitudes in the direction AR2 horizontal to the surface of the silicon substrate S is applied to the silicon substrate S, a temperature of the silicon substrate S is more apt to increase than that of the coating film 16, but a local oxidization effect of the coating film 16 is provided by the rotation of the water molecules 17.

In the respective foregoing embodiments, the description has been given as to the conformation of applying the microwave 3 from the direction horizontal to the surface of the silicon substrate S, but the incidence direction of the microwave 3 is not necessarily restricted to the direction horizontal to the surface of the substrate S. As long as a polarizing plate is installed between the introduction port of the microwave 3 and the silicon substrate S, overheating of the silicon substrate S alone can be avoided by adopting a incidence direction that forms an acute angle with the surface of the silicon substrate S, or more desirably, a direction that forms an angle in the range of ±45 degrees from the horizontal direction.

According to the substrate treatment method of at least one embodiment described above, since the method includes applying the microwave having the magnetic field or the electric field whose amplitude direction is vertical to the surface of the semiconductor substrate to the semiconductor substrate to perform annealing, the reaction can be more efficiently promoted at a lower temperature than the thermal annealing, and a semiconductor apparatus having excellent characteristics can be manufactured.

(B) Microwave Irradiation Apparatus (1) Embodiment

Figure 18:
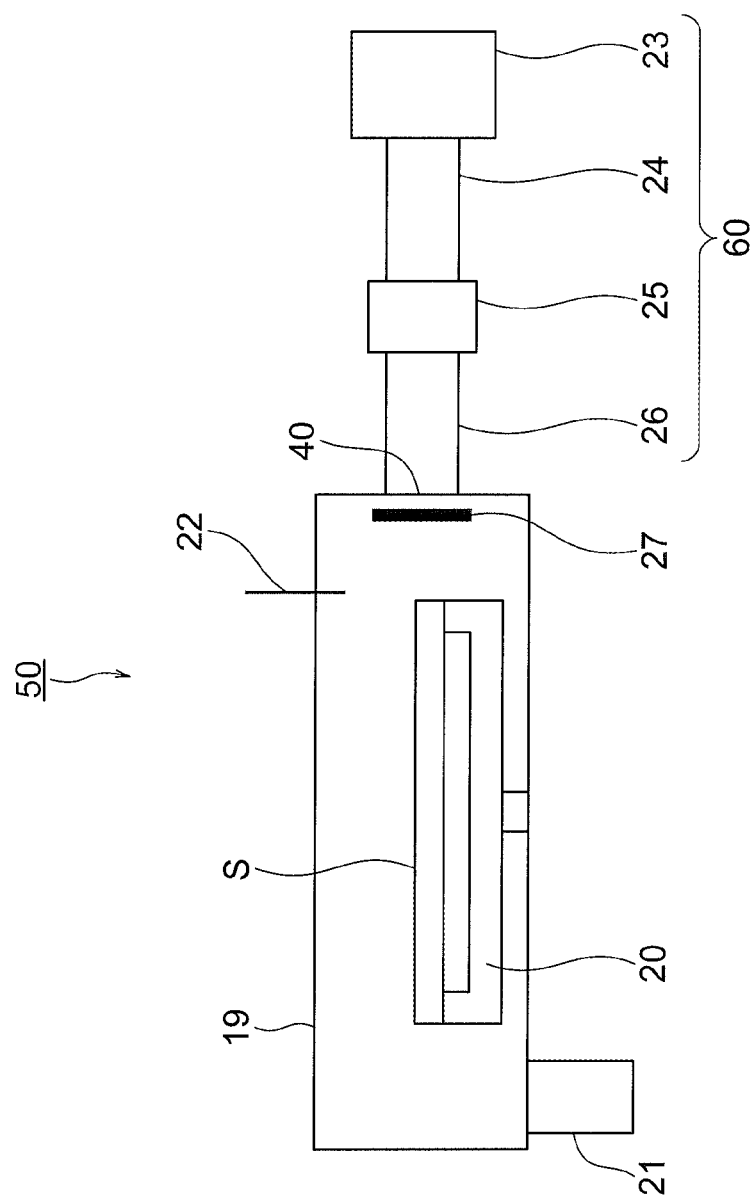
FIG. 18 is an example of a cross-sectional view showing an outline configuration of a microwave irradiation apparatus according to an embodiment.

FIG. 18 is an example of a cross-sectional view showing an outline configuration of a microwave irradiation apparatus according to an embodiment. The microwave irradiation apparatus according to this embodiment is a microwave annealing apparatus configured to realize the substrate treatment method according to the foregoing embodiments.

As shown in FIG. 18, a microwave annealing apparatus 50 includes a chamber 19 that can accommodate a silicon substrate S, and a polarizing plate 27. In a wall surface of the chamber 19 there is provided an introduction port 40 through which microwaves applied from outside the chamber 19 are introduced into the chamber 19. The polarizing plate 27 is installed between the introduction port 40 and the semiconductor substrate S.

The microwave annealing apparatus 50 further includes a susceptor 20, a gas introduction pipe 22, and an exhaust port 21.

The susceptor 20 holds the silicon substrate S, is coupled with a non-illustrated rotary drive mechanism, and rotates the silicon substrate S in a plane horizontal to a surface of the silicon substrate S. The gas introduction pipe 22 enables an annealing treatment gas to be introduced into the chamber 19. The introduced treatment gas is discharged from the exhaust port 21.

The microwave annealing apparatus 50 further includes a microwave irradiator 60 which is coupled with the introduction port 40, generates microwaves, and applies them toward the silicon substrate S in the chamber 19.

The microwave irradiator 60 includes a magnetron 23, a launcher 24, an isolator 25, and a waveguide 26. The magnetron 23 generates a microwave 3, and the launcher 24 provides the generated microwave 3 with directionality and emits it. The emitted microwave 3 is transmitted through the isolator 25, and introduced into the chamber 19 through the waveguide 26. The isolator 24 is coupled with a non-illustrated dummy piping, and protects the magnetron 23 by allowing the dummy piping to absorb reflected waves that reach from the chamber 19 due to rotation of the susceptor 20 or the like.

The polarizing plate 27 has a mechanism that can adjust a polarizing direction to the applied microwaves to selectively transmit the microwave where an amplitude direction of a magnetic field or an electric field is vertical to the surface of the silicon substrate s like, e.g., the metal slit 8 shown in FIG. 1. Here, the term "selectively transmitting" means transmitting a microwave in such a manner that, when the amplitude direction of a magnetic field is desired to be vertical to the surface of the silicon substrate S, the magnetic field in the desired amplitude direction is stronger than the magnetic fields in other amplitude directions and in such a manner that, when the amplitude direction of an electric field is desired to be vertical to the surface of the silicon substrate S, the electric field in the desired amplitude direction is stronger than the electric fields in other amplitude directions.

The polarizing plate 27 is installed to be rotatable at least every 90° around a center axis which is a direction that runs through the center of the introduction port 40 and is horizontal to an incidence direction of the microwaves. Consequently, a direction of the polarizing plate 27 can be adjusted in accordance with each of annealing processes, in one of the annealing processes the direction vertical to the surface of the silicon substrate S being desirable as the amplitude direction of the magnetic field, and in another one of the annealing processes the direction vertical to the surface of the silicon substrate S being desirable as the amplitude direction of the electric field.

The polarizing plate 27 may be installed at any position as long as it is placed between the introduction port 40 and the semiconductor substrate S. However, a larger size than that of the introduction port 40 is required, and hence, in order to reduce costs, it is desirable to install the polarizing plate 27 near the introduction port 40 rather than to install it near the silicon substrate S.

In this embodiment, although the description has been given as to the conformation of applying the microwave 3 to the silicon substrate S from the horizontal direction, the present invention is not restricted thereto. As previously mentioned in the embodiments of the substrate treatment method, using the polarizing plate 27 enables avoiding overheating of the silicon substrate S alone as long as the microwave is applied from a direction that forms an acute angle with the surface of the silicon substrate S, or more desirably, from a direction that forms an angle in the range of ±45 degrees from the horizontal direction.

Several examples of the microwave annealing apparatus 50 shown in FIG. 18 will now be described with reference to FIG. 19 to FIG. 21.

(2) Examples

Figure 19:
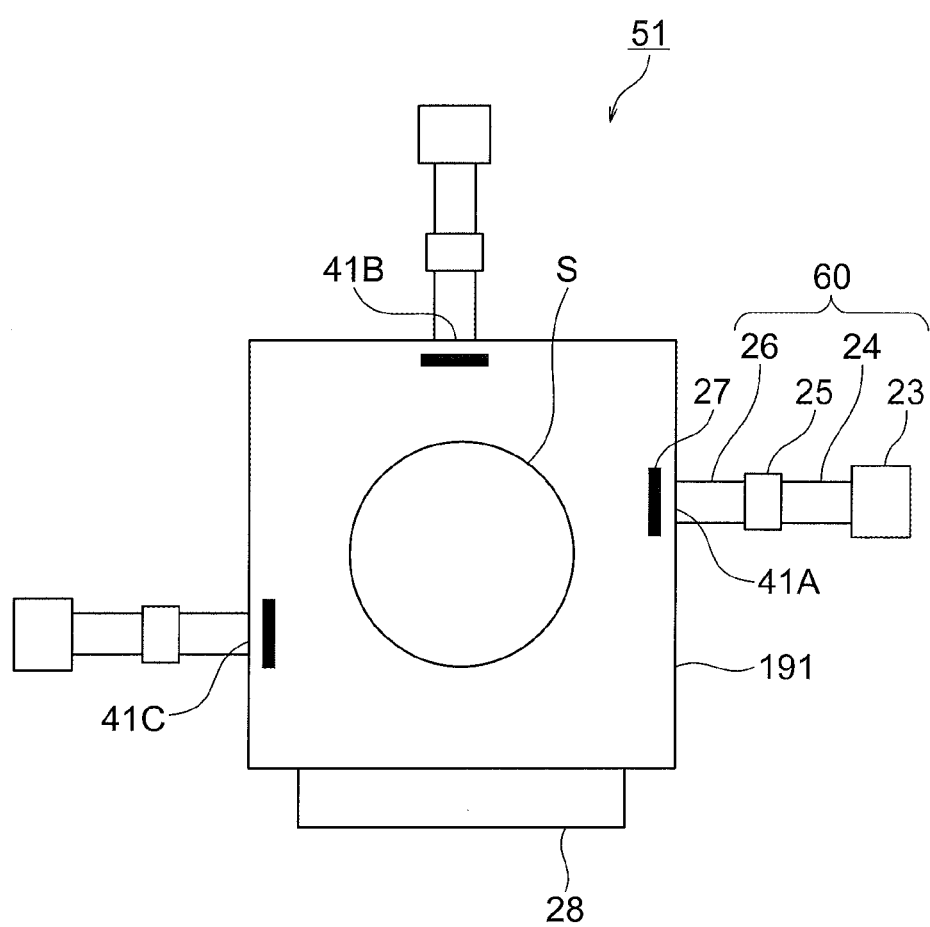
FIG. 19 is an example of a plan view showing an outline configuration of a microwave irradiation apparatus according to Example 1.

FIG. 19 is an example of a plan view showing an outline configuration of a microwave annealing apparatus according to Example 1. A microwave annealing apparatus 51 shown in FIG. 19 includes a chamber 191 having a rectangular planar shape, and further includes microwave irradiators 60 coupled with three introduction ports 41 (41A to 41C), respectively.

As can be seen from FIG. 19, of the three introduction ports 41, the introduction ports 41A and 41C facing each other are arranged so to be staggered each other in a direction orthogonal to a microwave introducing direction from a frontal direction rather than being arranged on the same microwave introducing direction. When the planar shape of the chamber 19 is a polygon with n angles where n is an even number in this manner, the introduction ports facing each other are arranged to be slightly staggered from the frontal direction. That is because, when the introduction ports facing each other are arranged right in front of each other, the microwaves from the opposed sides are monitored as reflected waves, and control over the power is made complicated. Therefore, as a staggering direction, it is possible to adopt not only the direction horizontal to the surface of the silicon substrate S but also the direction vertical to the surface of the silicon substrate S.

Figure 20:
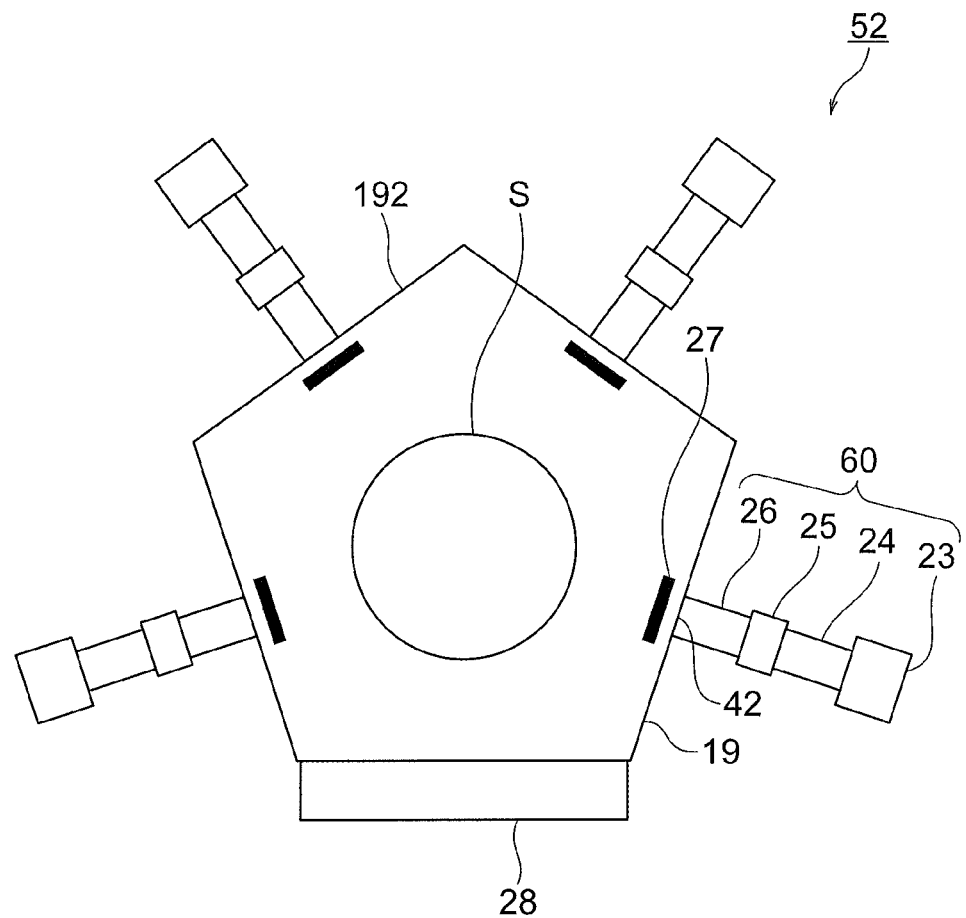
FIG. 20 is an example of a plan view showing an outline configuration of a microwave irradiation apparatus according to Example 2.
Figure 21:
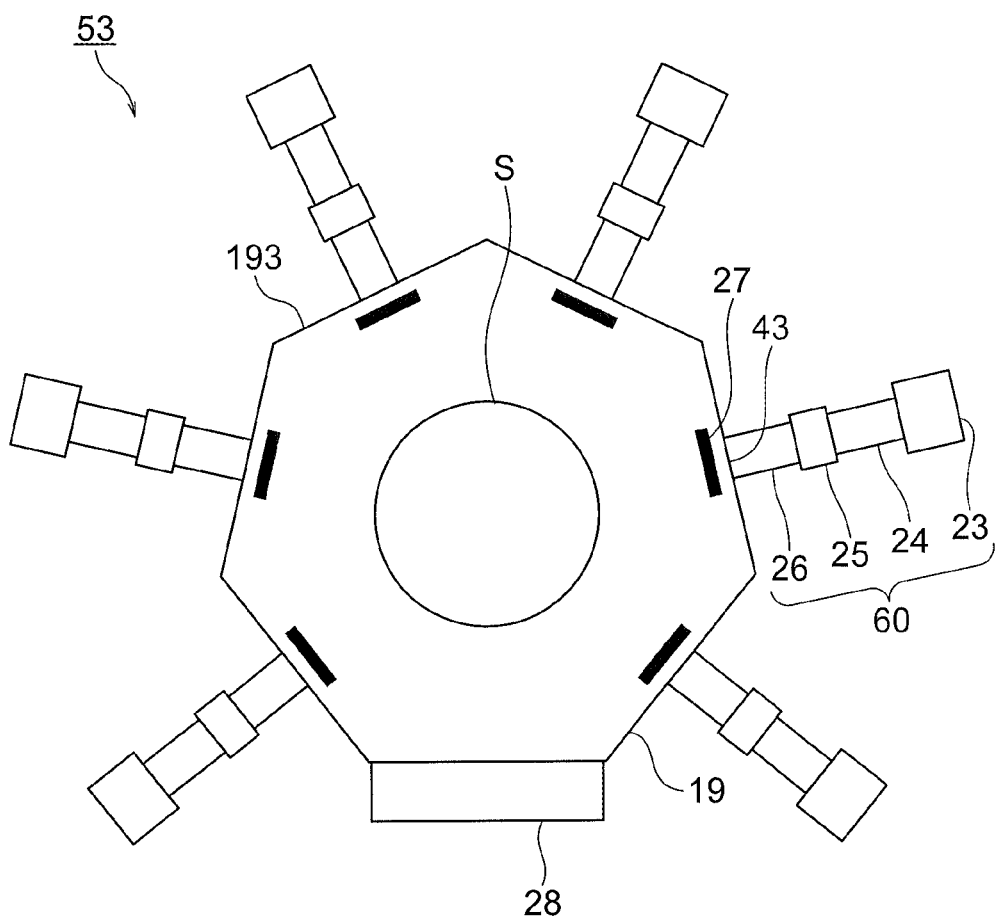
FIG. 21 is an example of a plan view showing an outline configuration of a microwave irradiation apparatus according to Example 3.

FIG. 20 and FIG. 21 show microwave annealing apparatuses according to Examples 2 and 3, respectively. Like these microwave annealing apparatuses 52 and 53, when the apparatuses include chambers 192 and 193 each having a planar shape which is a polygon with n angles where n is an odd number respectively, since the microwaves do not enter introduction ports 42 and 43 each of which is coupled with the microwave irradiator 60 from the frontal direction, the introduction ports 42 and 43 can be provided at any positions in respective wall surfaces as long as they are wall surfaces facing the substrate S.

It is to be noted that, in all the microwave annealing apparatuses 51 to 43 according to Examples 1 to 3, gate valves 28 are provided for blocking of air or connection with a transfer chamber (not shown), respectively.

As a frequency of the microwaves 3, although any frequency between 1 GHz to 50 GHz can be used, when 2.45 GHz, 5.80 GHz, 24.125 GHz, or the like which is in an ISM (Industry-Science-Medical) band is used, various components including the waveguide 26 have been already prepared as products, and hence costs can be reduced.

According to the microwave irradiation apparatus of at least one embodiment described above, since the apparatus includes the chamber having the introduction port from which the microwaves applied to the semiconductor substrate from the direction horizontal to the surface of the semiconductor substrate or the direction forming an acute angle with the surface of the semiconductor substrate are introduced and the polarizing plate installed between the introduction port and the semiconductor substrate, a reaction can be more efficiently promoted at a lower temperature than the thermal annealing, thereby manufacturing the semiconductor apparatus having excellent characteristics.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A microwave irradiation apparatus comprising:
a chamber which is configured to accommodate a substrate and is provided with an introduction port to introduce the microwave applied to the substrate from a direction at an angle within a range of ±45 degrees to a direction horizontal to a surface of the substrate; and
a polarizing plate which is installed between the introduction port and the substrate, and selectively transmits a microwave where an amplitude direction of a magnetic field or an electric field is vertical to the surface of the substrate.

2. The apparatus of claim 1,
wherein the polarizing plate comprises a slit whose longitudinal direction is a direction parallel or vertical to the surface of the substrate.

3. The apparatus of claim 1,
wherein the polarizing plate is installed to be rotatable at least every 90° around a center axis in a direction horizontal to an incidence direction of the microwave.

4. The apparatus of claim 1,
wherein the polarizing plate is installed to be closer to a side of the introduction port than the middle between the introduction port and the substrate.

5. The apparatus of claim 1, further comprising a susceptor which holds the substrate and rotates the substrate in a plane horizontal to the surface of the substrate.

6. The apparatus of claim 1, further comprising a microwave irradiator which generates the microwave and applies the microwave to the substrate through the introduction port.

7. The apparatus of claim 6, comprising:
the microwave irradiators and
the polarizing plates which are installed between the introduction port and the substrate in correspondence with each of the microwave irradiators,
wherein the chamber is provided with the introduction port in correspondence with each of the microwave irradiators.

8. The apparatus of claim 1,
wherein the polarizing plate transmits a microwave in such a manner that, when a microwave where an amplitude direction of a magnetic field is vertical to the surface of the substrate is selectively transmitted, the magnetic field in the amplitude direction vertical to the surface of the substrate is stronger than the magnetic fields in other amplitude directions, and in such a manner that, when a microwave where an amplitude direction of an electric field is vertical to the surface of the substrate is selectively transmitted, the electric field in the amplitude direction vertical to the surface of the substrate is stronger than the electric fields in other amplitude directions.

9. A substrate treatment method, comprising:
introducing a microwave toward a substrate from a direction at an angle within a range of ±45 degrees to a direction horizontal to the surface of the substrate, and
polarizing the microwave in such a manner that an amplitude direction of a magnetic field of the microwave applied to the substrate is vertical to the surface of the substrate.

10. The method of claim 9, wherein the microwave is polarized by passing through a slit whose longitudinal direction is horizontal to the surface of the substrate.

11. A substrate treatment method, comprising:
introducing a microwave toward a substrate from a direction at an angle within a range of ±45 degrees to a direction horizontal to the surface of the substrate, and polarizing the microwave in such a manner that an amplitude direction of an electric field of the microwave applied to the substrate is vertical to the surface of the substrate.

12. The method of claim 11,
wherein the microwave is polarized by passing through a slit whose longitudinal direction is vertical to the surface of the substrate.

13. The method of claim 11, wherein the substrate comprises a film which contains carbon (C) and water molecules and is formed on a silicon substrate.

\* \* \* \* \*